(12) United States Patent
Kim

(10) Patent No.: US 7,611,945 B2
(45) Date of Patent: Nov. 3, 2009

(54) METHOD AND RESULTING STRUCTURE FOR FABRICATING DRAM CAPACITOR STRUCTURE

(75) Inventor: Jeong Gi Kim, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/853,347

(22) Filed: Sep. 11, 2007

(65) Prior Publication Data
US 2008/0160687 A1 Jul. 3, 2008

(30) Foreign Application Priority Data
Dec. 27, 2006 (CN) .................... 2006 1 0148388

(51) Int. Cl.
*H01L 21/8242* (2006.01)
(52) U.S. Cl. .................. 438/253; 438/254; 438/396; 257/E21.648
(58) Field of Classification Search .......... 438/253–255, 438/396–398; 257/E21.648
See application file for complete search history.

(56) References Cited

U.S. PATENT DOCUMENTS

2003/0067029 A1* 4/2003 Zheng .................. 257/309
2005/0196920 A1* 9/2005 Suzuki .................. 438/253
2006/0286744 A1* 12/2006 Nishikawa et al. .......... 438/240

* cited by examiner

*Primary Examiner*—Hoai v Pham
(74) *Attorney, Agent, or Firm*—Townsend and Townsend and Crew LLP

(57) ABSTRACT

A method for forming a capacitor structure for a dynamic random access memory device. The method includes forming a device layer overlying a semiconductor substrate, e.g., silicon wafer. The method includes forming a first interlayer dielectric overlying the device layer and forming a via structure within the first interlayer dielectric layer. The method includes forming a first oxide layer overlying the first interlayer dielectric layer and forming a stop layer overlying the first oxide layer. The method includes forming a second oxide layer overlying the first stop layer and forming a trench region through a portion of the second oxide layer, through a portion of the stop layer, and a portion of the second oxide layer. A bottom electrode structure is formed to line the trench region. The bottom electrode structure includes an inner region. The bottom electrode structure is coupled to the via structure. The method includes protecting the bottom electrode structure with a masking layer and selectively removing the second oxide layer to the stop layer, the stop layer acts as an etch stop, to expose an outer region of the bottom electrode structure. The method includes forming a capacitor dielectric layer overlying the outer region of the bottom electrode structure and overlying the inner region of the bottom electrode structure. The method includes forming an upper capacitor plate overlying the capacitor dielectric layer to form a capacitor structure.

20 Claims, 9 Drawing Sheets

US 7,611,945 B2

METHOD AND RESULTING STRUCTURE FOR FABRICATING DRAM CAPACITOR STRUCTURE

CROSS-REFERENCES TO RELATED APPLICATIONS

This application claims priority to Chinese Application No. 200610148388.5; filed on Dec. 27, 2006; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and structures for manufacturing a capacitor structure for dynamic random access memory devices, commonly called DRAMs. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of capacitor structures for memory devices. Such capacitor structures include, among others, trench, fin, and stacked designs. Although there have been significant improvements, such designs still have many limitations. As merely an example, these designs must become smaller and smaller but still require large capacitance values to be stored. Additionally, these capacitor designs are often difficult to manufacture and generally require complex manufacturing processes and structures, which lead to inefficiencies and may cause low yields from leakages. These and other limitations will be described in further detail throughout the present specification and more particularly below.

From the above, it is seen that an improved technique for processing semiconductor devices is desired.

SUMMARY OF THE INVENTION

According to the present invention, techniques for processing integrated circuits for the manufacture of semiconductor devices are provided. More particularly, the invention provides a method and structures for manufacturing a capacitor structure for dynamic random access memory devices, commonly called DRAMs. But it would be recognized that the invention has a much broader range of applicability.

In a specific embodiment, the present invention provides a method for forming a capacitor structure for a dynamic random access memory device. The method includes forming a device layer (e.g., MOS transistors, PMOS transistors, NMOS transistors) overlying a semiconductor substrate, e.g., silicon wafer, silicon on insulator wafer. The method includes forming a first interlayer dielectric overlying the device layer and forming a via structure within the first interlayer dielectric layer. The method includes forming a first oxide layer overlying the first interlayer dielectric layer and forming a stop layer overlying the first oxide layer. The method includes forming a second oxide layer overlying the first stop layer and forming a trench region through a portion of the second oxide layer, through a portion of the stop layer, and through a portion of the second oxide layer. A bottom electrode structure is formed to line the trench region. The bottom electrode structure includes an inner region. The bottom electrode structure is coupled to the via structure. The method includes protecting the bottom electrode structure with a masking layer and selectively removing the second oxide layer to the stop layer, which acts as an etch stop, to expose an outer region of the bottom electrode structure. The method includes forming a capacitor dielectric layer overlying the outer region of the bottom electrode structure and overlying the inner region of the bottom electrode structure. The method includes forming an upper capacitor plate overlying the capacitor dielectric layer to form a capacitor structure.

In an alternative specific embodiment, the present invention provides a method for forming a plurality of capacitor structures for a dynamic random access memory device. The method includes forming a device layer comprising a plurality of MOS devices overlying a semiconductor substrate and forming a first interlayer dielectric overlying the device layer. The method includes forming a via structure within the first interlayer dielectric layer. The via structure is coupled to at least one of the MOS devices. The method includes forming a first oxide layer overlying the first interlayer dielectric layer and forming a stop layer overlying the first oxide layer. The method includes forming a second oxide layer overlying the first stop layer and forming a trench region through a portion of the second oxide layer, through a portion of the stop layer, and a portion of the second oxide layer. The trench region is defined by a width and length ratio of ten and greater. The method includes forming a bottom electrode structure to line the trench region and coupled to the via structure. The bottom electrode structure includes an inner region. The method includes protecting the bottom electrode structure with a masking layer and selectively removing the second oxide layer to the stop layer to expose an outer region of the bottom electrode structure. The stop layer acts as an etch stop. The method includes forming a capacitor dielectric layer overlying the outer region of the bottom electrode structure and overlying the inner region of the bottom electrode structure. The method also forms an upper capacitor plate overlying the capacitor dielectric layer to form a capacitor structure.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 0.13 microns and less. Additionally, pitch between capacitor structures can be 0.13 microns and less. Preferably, the invention provides a capacitor structure that uses both sides of the electrode structure for storing charge. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for manufacturing a capacitor structure for dynamic random access memory devices, commonly called DRAMs. But it would be recognized that the invention has a much broader range of applicability.

A method for fabricating a capacitor structure for a dynamic random access memory device according to an embodiment of the present invention may be outlined as follows:

1. Provide a semiconductor substrate;
2. Form a device layer (e.g., MOS transistors) overlying a semiconductor substrate;
3. Form a first interlayer dielectric, which is preferably planarized, overlying the device layer;
4. Form a via structure (e.g., plug) within the first interlayer dielectric layer;
5. Form a first oxide layer overlying the first interlayer dielectric layer, which may be planarized;
6. Form a stop layer (e.g., silicon nitride) overlying the first oxide layer;
7. Form a second oxide layer overlying the first stop layer;
8. Forming a trench region through a portion of the second oxide layer, through a portion of the stop layer, and through a portion of the second oxide layer to expose the via structure;
9. Form a bottom electrode structure to line the trench region, the bottom electrode structure including an inner region, the bottom electrode structure being coupled to the exposed via structure;
10. Optionally, form a hemispherical silicon bearing layer overlying the surfaces of the bottom electrode structure;
11. Protect the bottom electrode structure with a masking layer, e.g., photo resist;
12. Selectively remove the second oxide layer to the stop layer, the stop layer acts as an etch stop, to expose an outer region of the bottom electrode structure;
13. Form a capacitor dielectric layer overlying the outer region of the bottom electrode structure and overlying the inner region of the bottom electrode structure; and
14. Form an upper capacitor plate overlying the capacitor dielectric layer to form a capacitor structure; and
15. Perform other steps, as desired.

The above sequence of steps provides a method according to an embodiment of the present invention. As shown, the method uses a combination of steps including a way of forming a capacitor structure for a dynamic random access memory device. Other alternatives can also be provided where steps are added, one or more steps are removed, or one or more steps are provided in a different sequence without departing from the scope of the claims herein. Further details of the present method can be found throughout the present specification and more particularly below.

Figure 1:
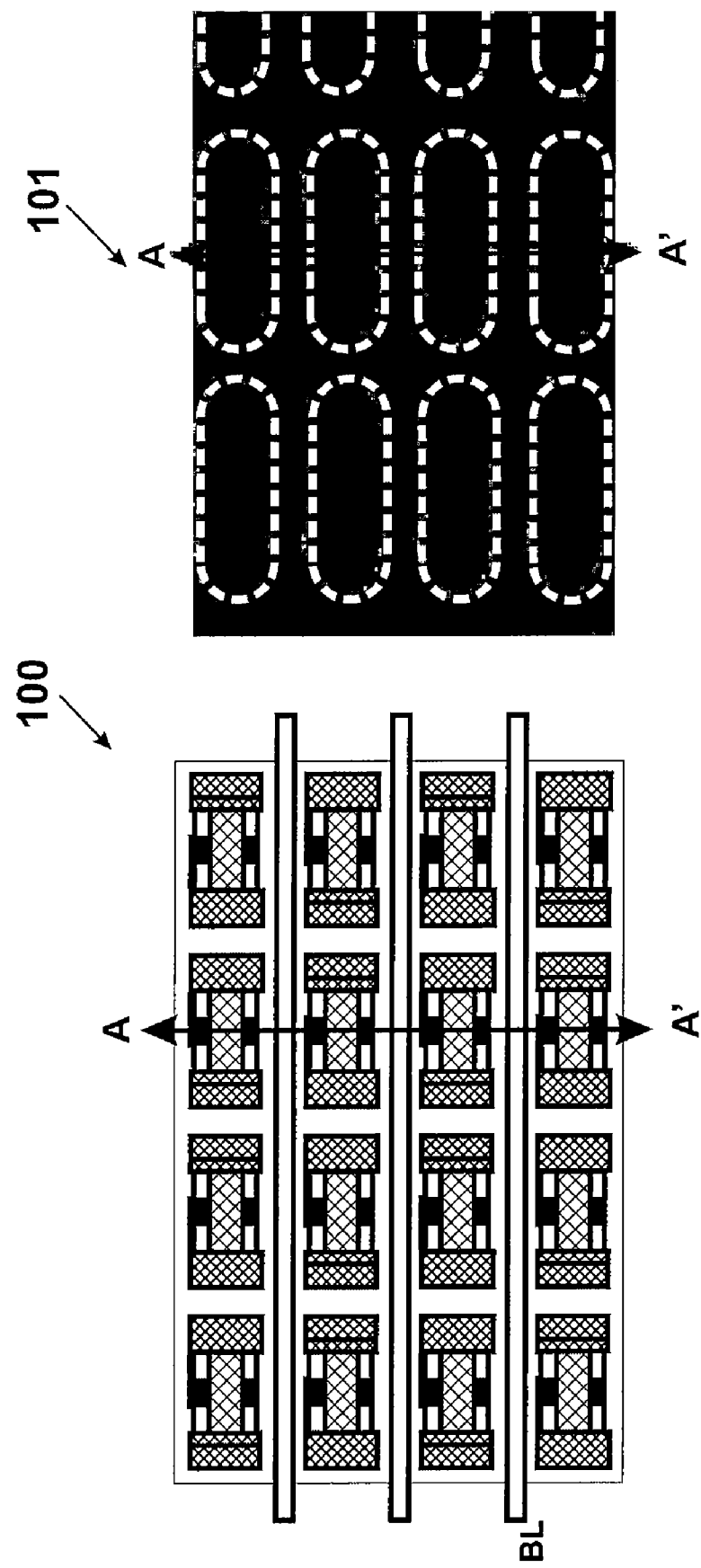
FIGS. 1 through 9 illustrate a method for forming a capacitor structure for a dynamic random access memory device according to an embodiment of the present invention.
Figure 2:
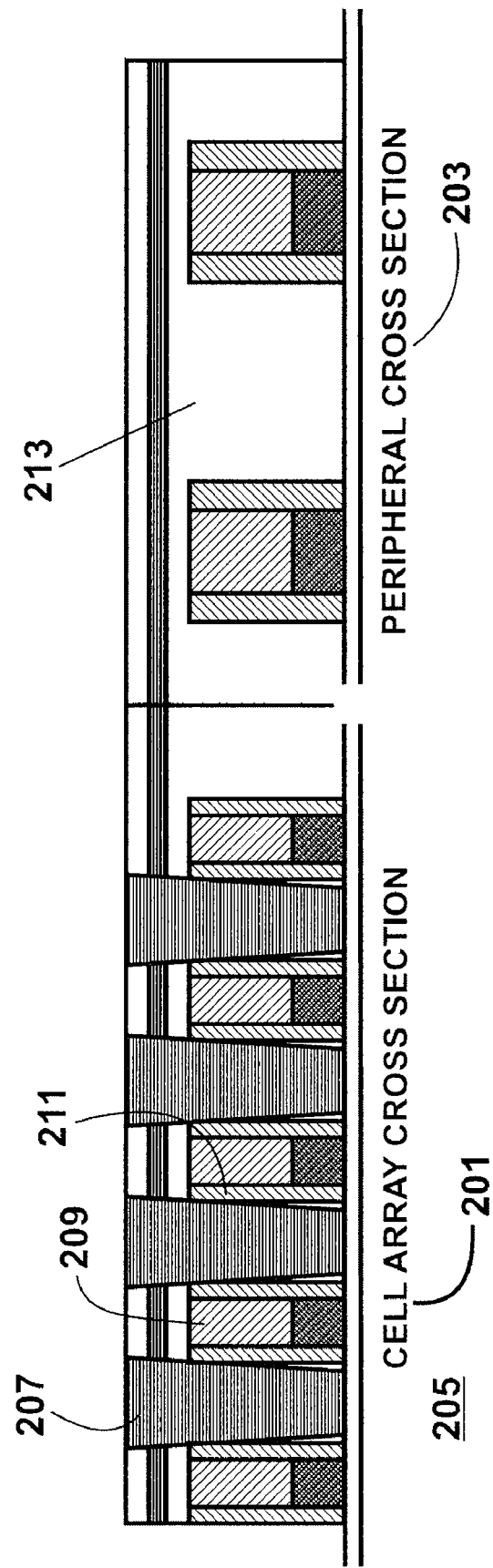

FIGS. 1 through 9 illustrate a method for forming a capacitor structure for a dynamic random access memory device according to an embodiment of the present invention. These diagrams are merely examples, which should not unduly limit the scope of the claims herein. One of ordinary skill in the art would recognize many variations, alternatives, and modifications. Referring to FIG. 1, a top-view diagram of a capacitor structure 100 is shown. A scanning electron microscope (SEM) photograph 101 of a capacitor structure is also shown. The present method is illustrated by way of the remaining figures, which are shown in cross-sectional views (see A to A'). Details regarding the present method are provided throughout the present specification and more particularly below.

The method includes providing a semiconductor substrate 205. The substrate includes cell array section 201 and peripheral cell region 203. The substrate includes a plurality of MOS transistor structures 209, including a polysilicon layer and a refractor metal layer. The transistor structures include a cap layer thereon. Sidewall spacers 211 are also included on each of the MOS transistor structures. Between each of the transistor structures may include via structures 207, e.g., plug structures. The structure also includes an interlayer dielectric layer 213. The peripheral section also includes a plurality of transistors for logic gates, etc. Preferably, the interlayer dielectric layer is planarized via chemical mechanical polishing and/or etch back techniques. Of course, one of ordinary skill in the art would recognize other variations, modifications, and alternatives.

Figure 3:
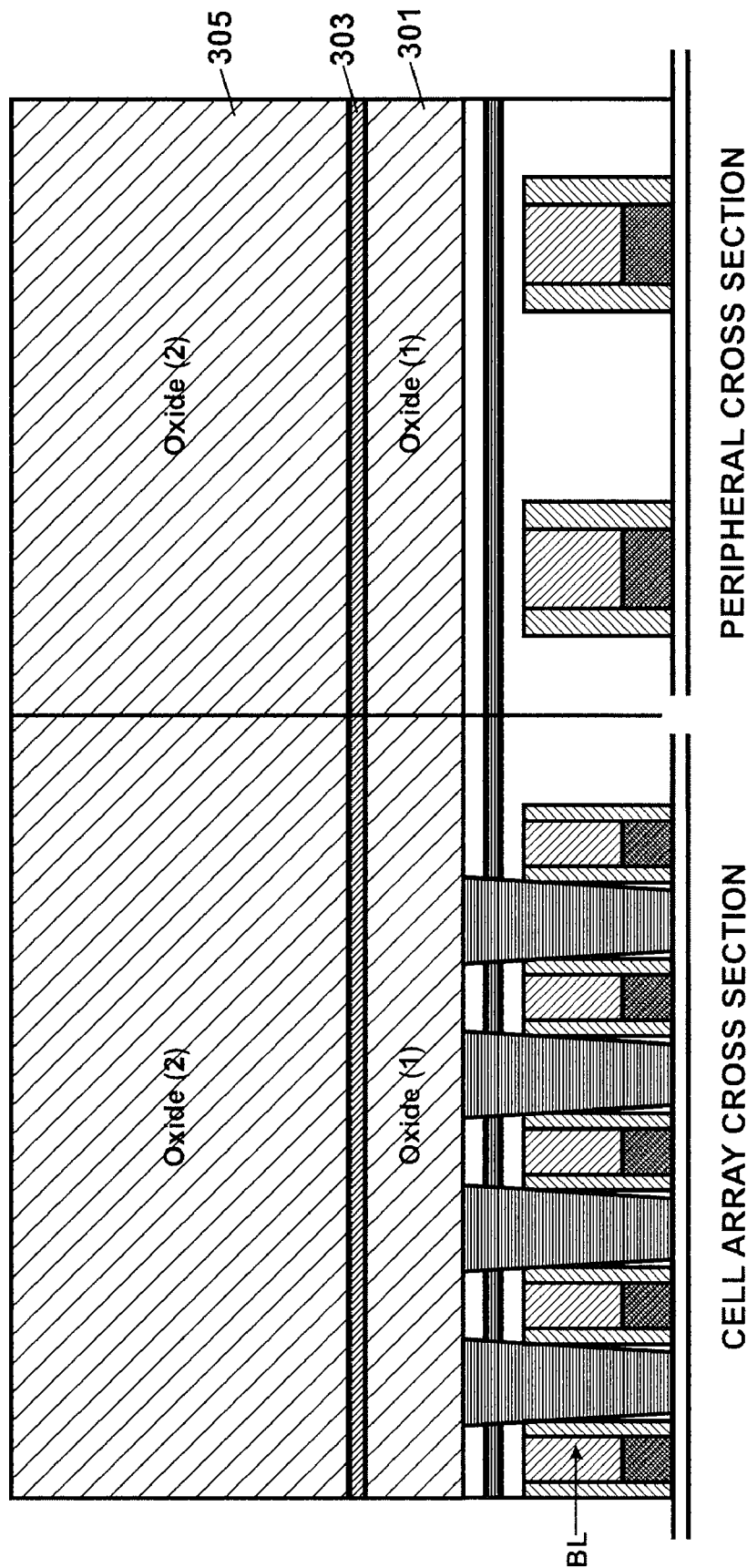

Referring to FIG. 3, the method includes forming a first oxide layer 301 overlying the first interlayer dielectric layer and forming a stop layer 303 overlying the first oxide layer. The first oxide layer can be selected from borophosphosilicate glass (BSPG), phosphosilicate glass (PSG), fluorinated silicon glass (FSG), tetraethyl orthosilicate (TEOS). The first oxide layer is preferably planarized. The stop layer can be made of a suitable material with different etching characteristics than an overlying oxide layer. The stop layer also has suitable mechanical properties for supporting a capacitor structure, which is free standing. Preferably, the stop layer can be made of a silicon nitride bearing material. The thickness of the stop layer can be about 50 to 100 Angstroms. Of course, other thicknesses can also be used. Additionally, the stop layer can be multiple layers or a composite material depending upon the application. The method includes forming a second oxide layer 305 overlying the first stop layer. The second oxide layer can be made of a similar material as the first oxide layer or other materials. The second oxide layer has a thickness that is greater than the first oxide layer in preferred embodiments. Although the first and second oxide layers were described as single layers, each of them may be composed of multiple layers depending upon the embodiment.

Figure 4:
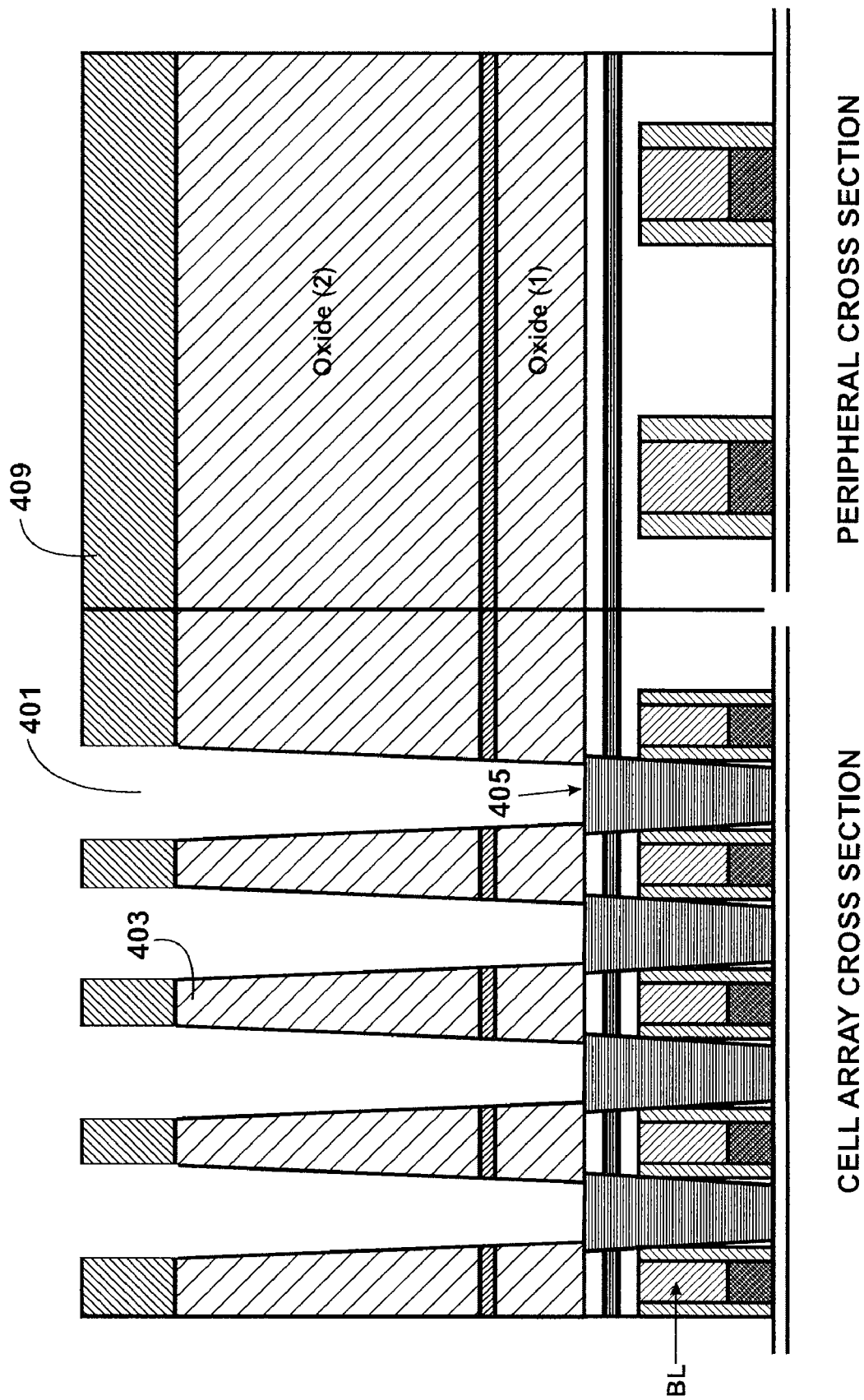

The method includes forming a trench region 401 through a portion of the second oxide layer, through a portion of the stop layer, and a portion of the second oxide layer, as shown in FIG. 4. The trench region is formed using a patterning technique. The patterning techniques uses patterned photomasking material 409. In a specific embodiment, the trench region has a width to length ratio of 1 to 10 and greater. The trench region is among a plurality of trenches, which are separated from each other by a portion of the first and second oxide layers and the stop layer 403. A spacing between two adjacent trenches may be about 0.13 microns and less depending upon the embodiment. Each of the trenches is larger at its opening and smaller toward a bottom region, which is overlying an exposed portion 405 of the via structure. Patterning each of the trench regions occurs using a reactive ion etching process with a fluorine bearing impurity. The etching process removes a portion of the second oxide layer, traverses through the stop layer, and removes a portion of the first oxide layer to form the trench region.

Figure 5:
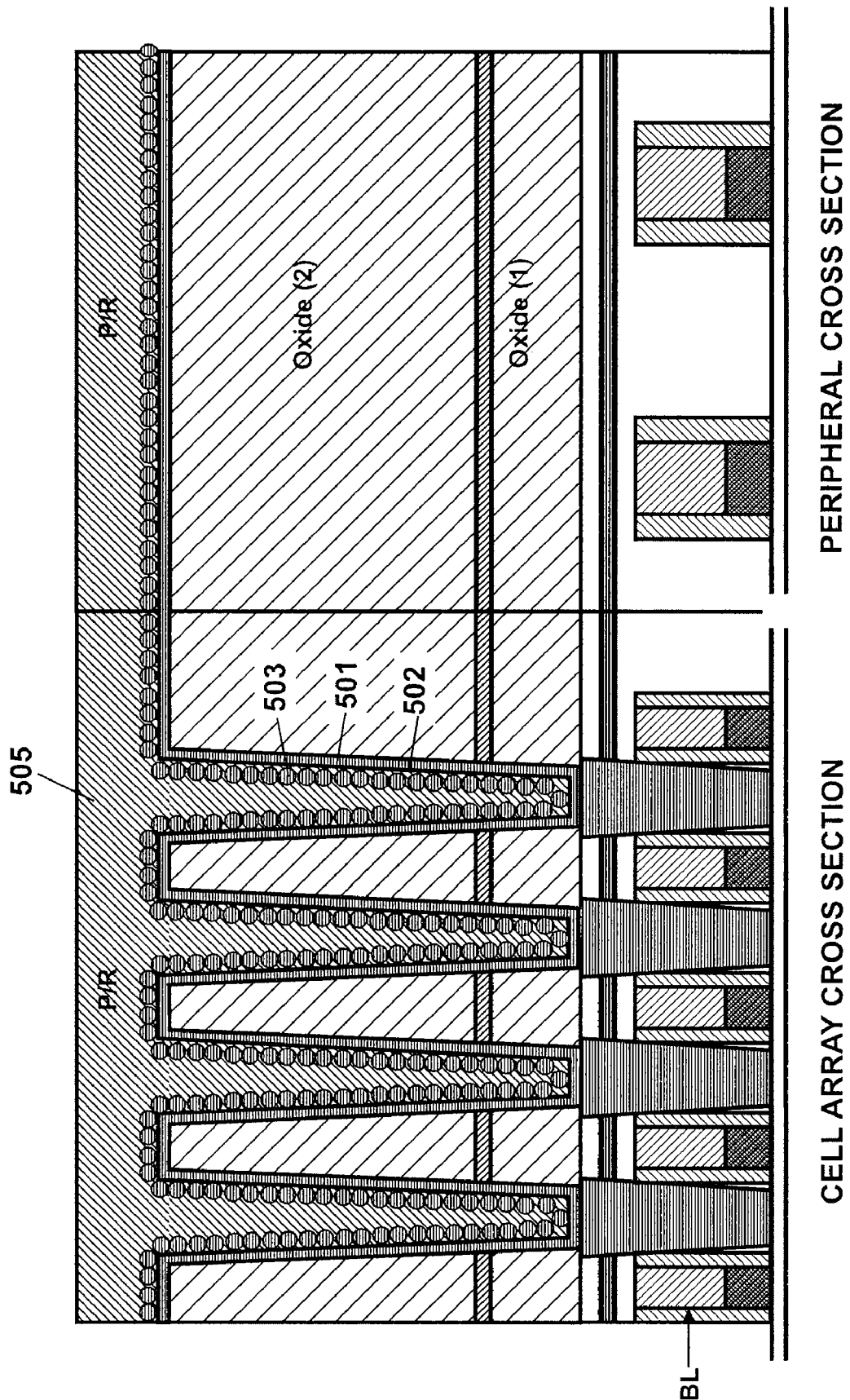

Referring now to FIG. 5, a bottom electrode structure 501 is formed to line the trench region. The bottom electrode structure includes an inner region 502. The bottom electrode structure is coupled to the via structure. The bottom electrode structure is made using a blanket deposition of polysilicon material. The polysilicon material is in-situ doped with an impurity (e.g., phosphorous) or diffused impurity. Preferably, the method forms a layer of hemispherical grain silicon material 503 overlying the inner region of the bottom electrode. The hemispherical silicon material is blanket deposited overlying exposed surfaces of the bottom electrode layer. The method includes protecting the bottom electrode structure with a masking layer 505. As shown, the masking material is photoresist that fills each of the trenches and extends overlying the surface of the second oxide layer.

Figure 6:
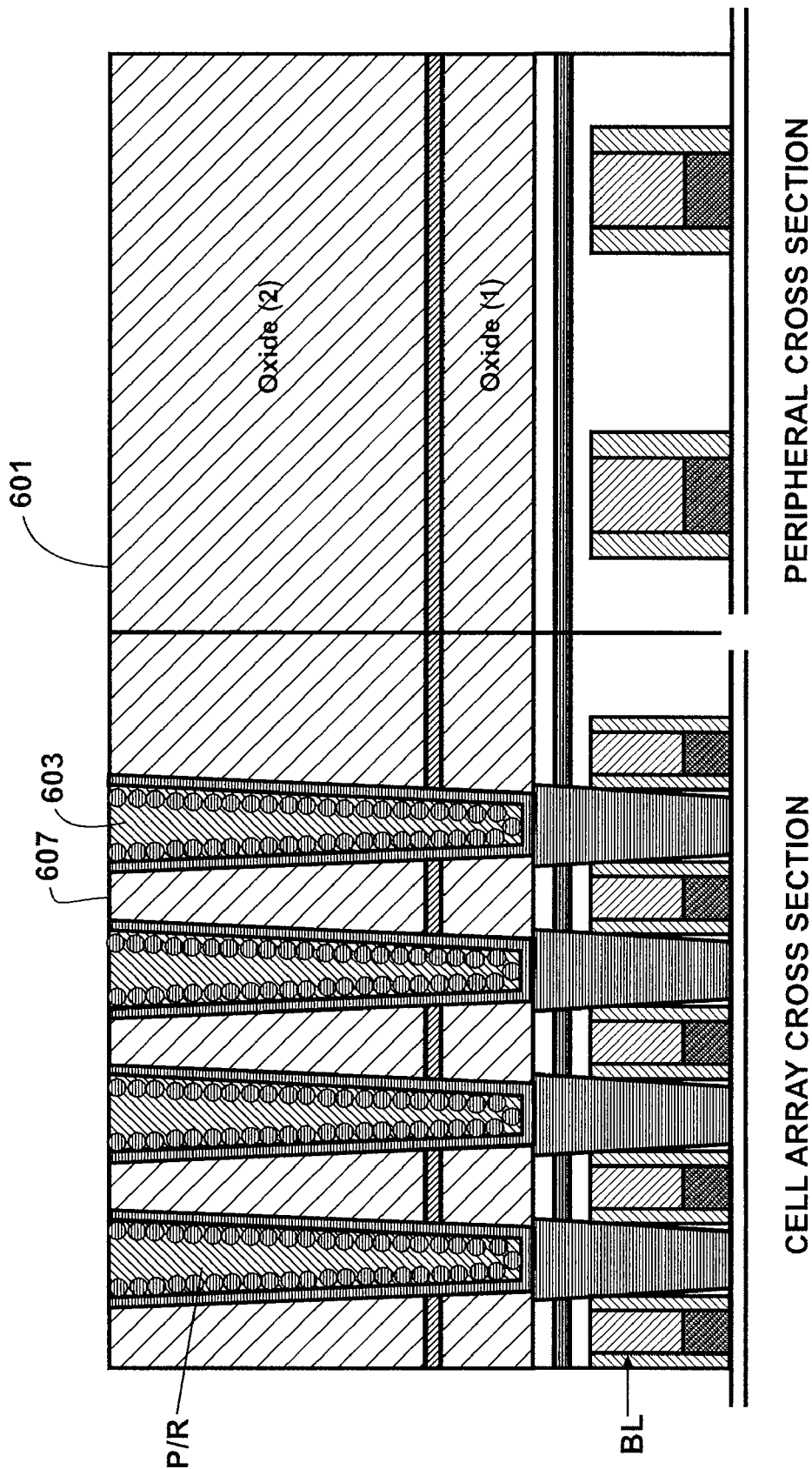

Referring to FIG. 6, the method removes the photomasking material from horizontal regions of the surface of the resulting structure. Preferably, the method uses a chemical mechanical polishing process to expose an upper surface of the oxide layer. Portions of the bottom electrode and hemispherical silicon overlying the horizontal surfaces of the second oxide layer are also removed. As shown, portions of the second oxide layer 601, 607 are exposed, while the photoresist fill material remains within the trench region 603.

Figure 7:
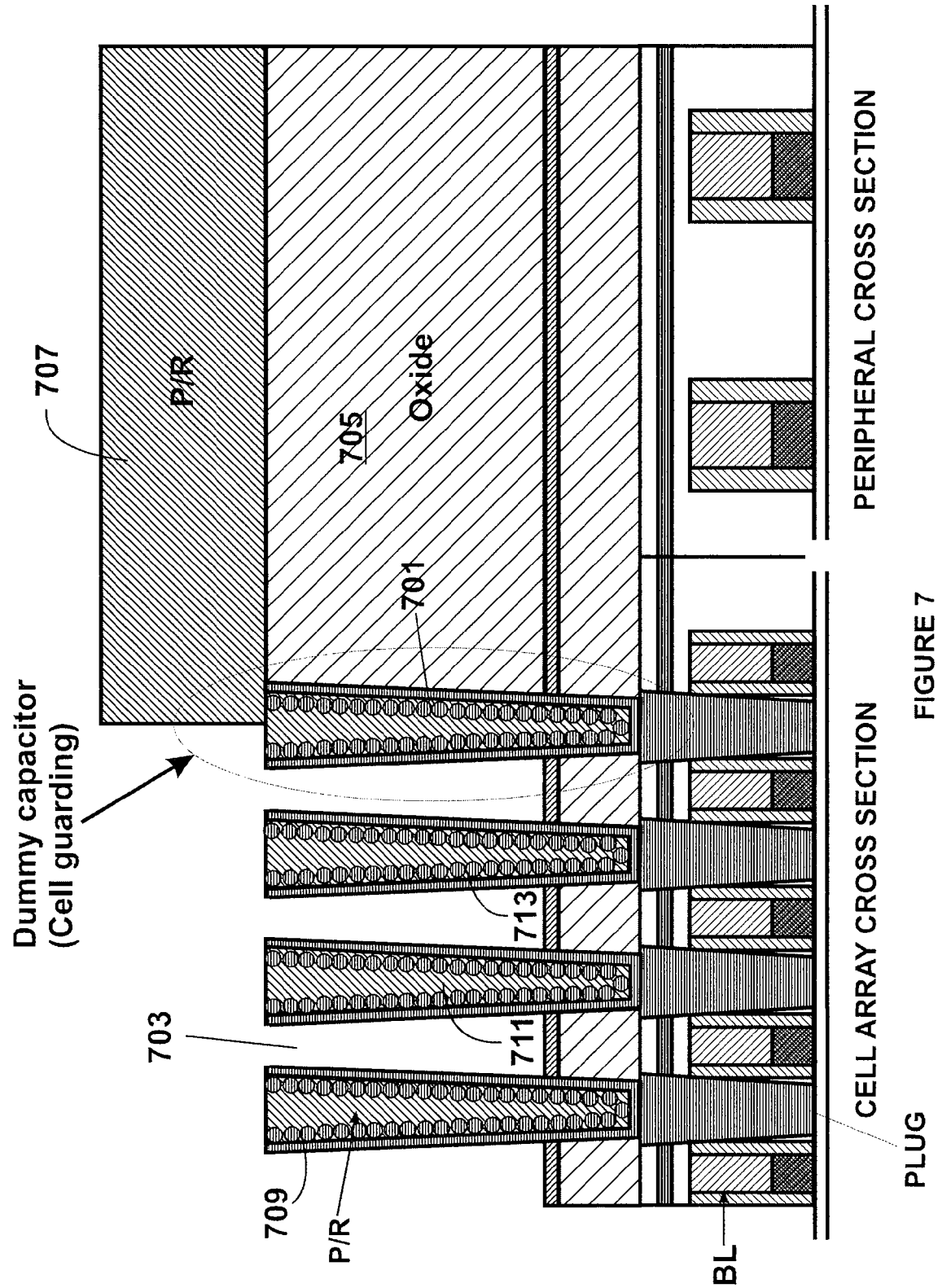

The method forms a protective layer 707 overlying the second oxide layer, while exposing top surfaces of the trench regions, as illustrated by FIG. 7. The protective layer also forms over a portion of trench region 701 to prevent any etching of the second oxide layer 705. The method selectively removes the second oxide layer to the stop layer, which acts as an etch stop, to expose an outer region 703 of the bottom electrode structure. As shown, bottom electrodes 709, 711, and 713 are free standing, while being supported by portions of the first oxide layer and anchored by the stop layer. The stop layer sticks to the outer region of the bottom electrodes to hold each of the bottom electrodes in place according to a preferred embodiment.

Figure 8:
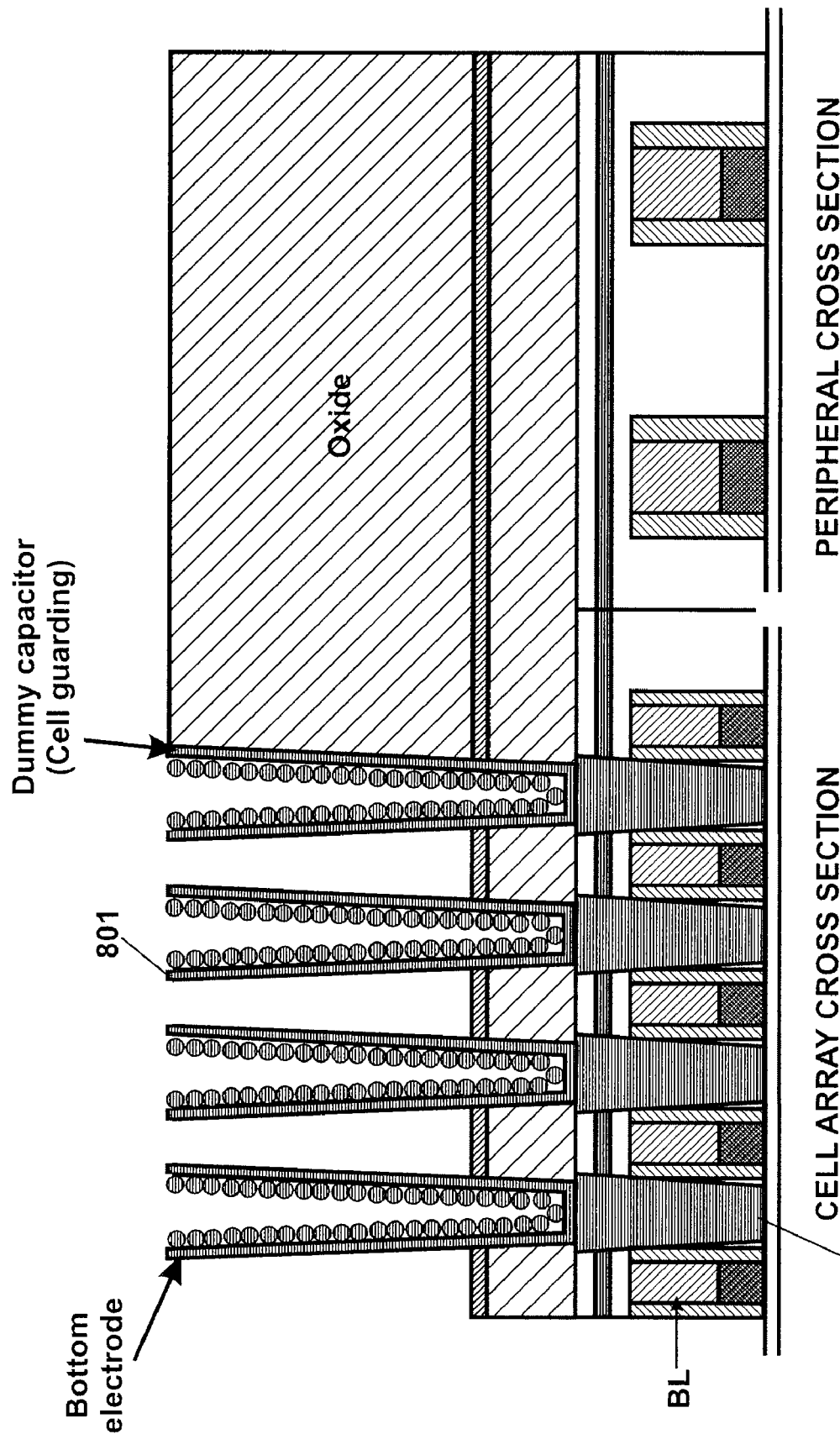
Figure 9:
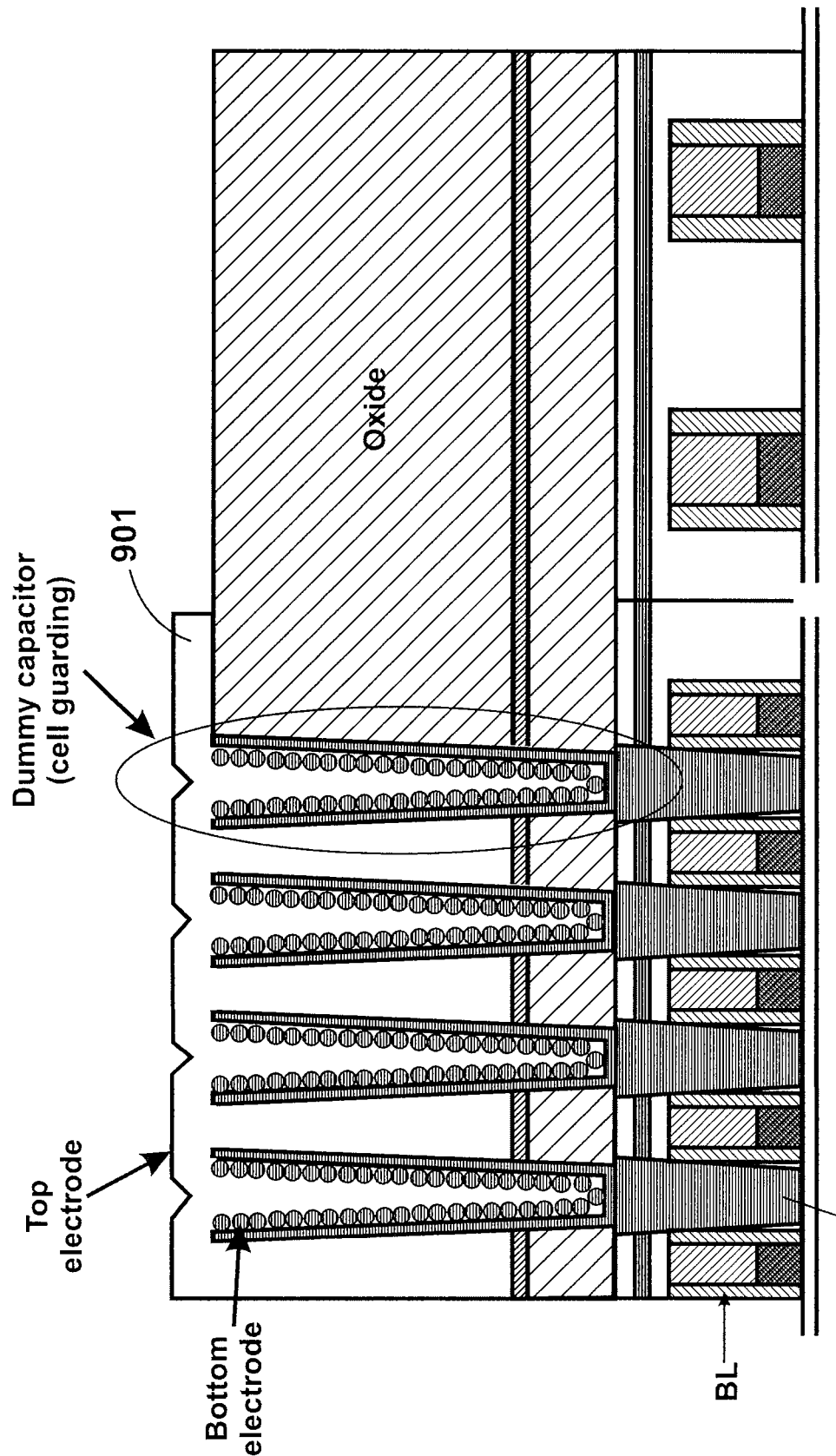

The method includes removing the photoresist material from the trench regions to form free standing bottom electrodes 801 as shown in FIG. 8. As shown, the bottom electrode has exposed outer regions that act as another portion of a capacitor structure. That is, the surface area of the bottom electrode has been increased by the outer regions for each of the bottom electrodes. The method includes forming a capacitor dielectric layer overlying the outer region of the bottom electrode structure and overlying the inner region of the bottom electrode structure. That is, both sides of the bottom electrode are covered with capacitor dielectric. The capacitor dielectric can include an oxide, nitride, or combination of oxide/nitride, or the like. The method includes forming an upper capacitor plate 901 overlying the capacitor dielectric layer to form a capacitor structure as shown in FIG. 9. The capacitor structure including the bottom electrode (both sides), capacitor dielectric, and top capacitor plate. The top capacitor plate is polysilicon that is in-situ doped or diffused, depending upon the embodiment. Of course, there can be other variations, modifications, and alternatives.

The above sequence of steps provides a method according to an embodiment of the present invention. As shown, the method uses a combination of steps including a way of forming a capacitor structure for a dynamic random access memory device. Other alternatives can also be provided where steps are added, one or more steps are removed, or one or more steps are provided in a different sequence without departing from the scope of the claims herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a capacitor structure for a dynamic random access memory device, the method comprising:
    forming a device layer overlying a semiconductor substrate;
    forming a first interlayer dielectric overlying the device layer;
    forming a via structure within the first interlayer dielectric layer;
    forming a first oxide layer overlying the first interlayer dielectric layer;
    forming a stop layer overlying the first oxide layer;
    forming a second oxide layer overlying the first stop layer;
    forming a trench region through a portion of the second oxide layer, through a portion of the stop layer, and a portion of the first oxide layer;
    forming a bottom electrode structure to line the trench region, the bottom electrode structure including an inner region, the bottom electrode structure being coupled to the via structure;
    protecting the bottom electrode structure with a masking layer, the masking layer filling an entirety of the trench region and overlying the second oxide layer;
    selectively removing the second oxide layer to the stop layer, the stop layer acting as an etch stop, to expose an outer region of the bottom electrode structure, while maintaining the masking layer within the trench region;
    forming a capacitor dielectric layer overlying the outer region of the bottom electrode structure and overlying the inner region of the bottom electrode structure; and
    forming an upper capacitor plate overlying the capacitor dielectric layer to form a capacitor structure.

2. The method of claim 1 wherein the trench region has an aspect ratio greater than 10 (height to width).

3. The method of claim 1 wherein the stop layer comprises a silicon nitride layer.

4. The method of claim 1 further comprising depositing hemispherical grain silicon material overlying the inner region of the bottom electrode after forming the bottom electrode structure and the masking layer is formed within the entirety of the trench region overlying the bottom electrode including the hemispherical grain silicon.

5. The method of claim 1 wherein the first oxide layer is selected from BPSG, FSG, tetraethyl orthosilicate (TEOS).

6. The method of claim 1 wherein the second oxide layer is selected from BPSG, FSG, tetraethyl orthosilicate (TEOS).

7. The method of claim 1 wherein the via structure comprises a plug structure.

8. The method of claim 1 wherein the selectively removing comprises wet etching using buffered oxide etch.

9. The method of claim 1 wherein the stop layer comprises a thickness of about 50 to about 100 Angstroms.

10. The method of claim 1 wherein the upper capacitor plate comprises a polysilicon material.

11. A method for forming a plurality of capacitor structures for a dynamic random access memory device, the method comprising:

forming a device layer comprising a plurality of MOS devices overlying a semiconductor substrate;

forming a first interlayer dielectric overlying the device layer;

forming a via structure within the first interlayer dielectric layer, the via structure being coupled to at least one of the MOS devices;

forming a first oxide layer overlying the first interlayer dielectric layer;

forming a stop layer overlying the first oxide layer;

forming a second oxide layer overlying the first stop layer;

forming a trench region through a portion of the second oxide layer, through a portion of the stop layer, and a portion of the first oxide layer, the trench region being defined by a width and length ratio of ten and greater;

forming a bottom electrode structure to line the trench region and coupled to the via structure, the bottom electrode structure including an inner region;

protecting the bottom electrode structure including the hemispherical grain silicon material with a masking layer, the masking layer filling an entirety of the trench region and overlying the second oxide layer;

selectively removing the second oxide layer to the stop layer, the stop layer acting as an etch stop, to expose an outer region of the bottom electrode structure, while maintaining the masking layer within the trench region;

forming a capacitor dielectric layer overlying the outer region of the bottom electrode structure and overlying the inner region of the bottom electrode structure; and forming an upper capacitor plate overlying the capacitor dielectric layer to form a capacitor structure.

12. The method of claim 11 wherein the trench region has an aspect ratio greater than 15 (height to width).

13. The method of claim 11 wherein the stop layer comprises a silicon nitride layer.

14. The method of claim 11 further comprising depositing hemispherical grain silicon material overlying the inner region of the bottom electrode after forming the bottom electrode structure, the masking layer is formed within the entirety of the trench region overlying the bottom electrode including the hemispherical grain silicon, and the second oxide layer is selectively removed to the stop layer to expose an outer region of the bottom electrode structure, while maintaining the masking layer within the trench region.

15. The method of claim 11 wherein the first oxide layer is selected from BPSG, FSG, tetraethyl orthosilicate (TEOS).

16. The method of claim 11 wherein the second oxide layer is selected from BPSG, FSG, tetraethyl orthosilicate (TEOS).

17. The method of claim 11 wherein the via structure comprises a plug structure.

18. The method of claim 11 wherein the selectively removing comprises wet etching using buffered oxide etch.

19. The method of claim 11 wherein the stop layer comprises a thickness of about 50 to about 100 Angstroms.

20. The method of claim 11 wherein the upper capacitor plate comprises a polysilicon material.

* * * * *